United States Patent [19]

Oguro

[11] Patent Number: 5,242,855
[45] Date of Patent: Sep. 7, 1993

[54] METHOD OF FABRICATING A POLYCRYSTALLINE SILICON FILM HAVING A REDUCED RESISTIVITY

[75] Inventor: Shizuo Oguro, Tokyo, Japan

[73] Assignee: NEC Corporation, Tokyo, Japan

[21] Appl. No.: 953,137

[22] Filed: Sep. 29, 1992

[30] Foreign Application Priority Data

Sep. 30, 1991 [JP] Japan ................................ 3-276434

[51] Int. Cl.[5] ..................... H01L 21/20; H01L 21/225
[52] U.S. Cl. .................................. 437/109; 437/233; 437/967; 437/160
[58] Field of Search ............. 148/DIG. 25, DIG. 122; 437/109, 160, 162, 247, 233, 967

[56] References Cited

U.S. PATENT DOCUMENTS 5,147,826 9/1992 Liu et al. .
5,155,051 10/1992 Noguchi et al. .

FOREIGN PATENT DOCUMENTS 1-59867 3/1989 Japan .
1-223719 9/1989 Japan .
2-81421 3/1990 Japan .
2171844 9/1986 United Kingdom .

OTHER PUBLICATIONS

"Novel Highly Conductive Polycrystalline Silicon Films Reducing Processing Temperature Down to 650° C.", by T. Kobayashi, et al., Extended Abstracts of the 20th (1988 International) Conference on Solid State Devices and Materials, Tokyo, 1988, pp. 57–60.

Primary Examiner—George Fourson
Attorney, Agent, or Firm—Burns, Doane, Swecker & Mathis

[57] ABSTRACT

Disclosed is a method of forming a polycrystalline silicon film on a silicon oxide film in which the polycrystalline silicon film includes crystal grains having a large size, typically 4 micrometers, thereby permitting the resistivity of the polycrystalline silicon film to effectively be reduced. An amorphous silicon film is deposited on the silicon oxide film by using a chemical vapor deposition in which the flow rate of impurity gas remains at zero during an initial deposition, after which the flow rate is gradually increased from zero to a predetermined value during a final deposition. Thus, the amorphous silicon film comprises double layers, or an impurity unmixed region abutting the silicon oxide film and an impurity mixed region. After that, by a heat treatment, the amorphous silicon film is crystallized to form a polycrystalline silicon film. Concurrently, the impurity diffusion is accomplished.

12 Claims, 4 Drawing Sheets

METHOD OF FABRICATING A POLYCRYSTALLINE SILICON FILM HAVING A REDUCED RESISTIVITY

BACKGROUND OF THE INVENTION

The invention relates to a method of fabricating a semiconductor device including an improved polycrystalline silicon film, and more particularly to a method of forming an improved polycrystalline silicon film having a reduced resistivity and a good step coverage characteristic.

The method of forming semiconductor devices including an impurity doped polycrystalline silicon thin film are well known in the art. Generally, an impurity doped polycrystalline silicon film may be formed by the prior art fabrication method which will be described. A silicon substrate is prepared to form a semiconductor device having a polycrystalline silicon film. A silicon oxide film is formed on the silicon substrate. Subsequently, an amorphous silicon film is deposited on the silicon oxide film by using a deposition method such as a chemical vapor deposition (CVD).

In the deposition of the amorphous silicon film, a growth gas such as a silane ($SiH_4$) gas or a silane based gas is used, but also an impurity gas such as phosphine ($PH_3$) is used to introduce an impurity such as phosphorus (P) into amorphus silicon so that the impurity doped amorphous silicon film may be deposited FIG. 1 illustrates a characteristic of introduction of an impurity gas, namely a flow rate of the impurity gas during the deposition of the amphorus silicon film in which the phosphine gas is diluted with a nitrogen ($N_2$) gas up to 0.1%. From FIG. 1 of the prior art, it is understood that the flow rate of the impurity gas remains at a predetermined constant value, for instance, 6 sccm (standard cubic centimeter per minute) during the deposition of the amorphous silicon film.

Subsequently, the impurity doped amorphous silicon film is subjected to a heat treatment at a temperature in the range from 600° to 1000° C. thereby resulting in a crystallization of amorphus silicon to form an impurity doped polycrystalline silicon film. Such arts are disclosed in T. Kobayashi et al. Extended Abstracts of the 20th (1988 International) Conference on Solid State Devices and Materials, Tokyo, 1988, pp. 57.

Such polycrystalline silicon films formed by the above prior art method include crystal grains having a size of 1 to 2 micrometers. While the crystal grain size may be varied by conditions such as a temperature of a heat treatment, it is limited to the size in the above range from 1 to 2 micrometers. Then, it is difficult to produce larger crystal grains. The resistivity of the impurity doped polycrystalline silicon film tends to depend upon the crystal grain size. The realization of reduction of the resistivity requires a larger crystal grain size. It is, therefore, undesirable to apply such polycrystalline silicon film to devices such as thin film transistors which require a crystal grain size of several micrometers for possession of the reduced resistivity.

With regard to a step coverage characteristic, such impurity doped polycrystalline silicon films possess an inferior step coverage characteristic as compared with impurity undoped polycrystalline silicon films. As a result, it is difficult to use those films as a capacitive electrode in semiconductor devices. If those films are used, capacitance characteristics of the capacitive electrodes are substantially deteriorated.

SUMMARY OF THE INVENTION

Accordingly, it is a primary object of the present invention to provide a novel method of forming an impurity doped polycrystalline silicon film including large crystal grains for possession of a higher conductivity.

It is another object of the present invention to provide a novel method of forming an impurity doped polycrystalline silicon film possessing a desirable step coverage characteristic.

It is a further object of the present invention to provide a novel method of fabricating a semiconductor device including an improved impurity doped polycrystalline silicon film, which possesses a high speed performance and a higher driving ability.

It is yet a further object of the present invention to provide a novel method of fabricating a semiconductor memory device including an impurity doped polycrystalline silicon film, which possesses a higher capacitance.

The above and other objects, features and advantages of the present invention will be apparent from following descriptions.

In accordance with the present invention, an improved polycrystalline silicon film has a reduced resistivity and a good step coverage characteristic, which may be formed by the following method. First, a silicon substrate is prepared, after which a silicon oxide film is formed on the silicon substrate. Subsequently, an amorphous silicon film is deposited on the silicon oxide film by using a deposition method such as a chemical vapor deposition.

In the deposition of the amorphous silicon film, an initial deposition for a predetermined time uses a growth gas only such as a silane based gas. Thus, in the initial deposition, the flow rate of an impurity gas such as a phosphine gas remains at approximately zero. Then, an amorphous silicon region deposited by the initial deposition, has no impurity such as phosphorus. In contrast, a final deposition of the amorphous silicon film uses not only the growth gas but the impurity gas in which the flow rate of the impurity gas is slowly and proportionally increased from approximately zero to a predetermined high value. Then, an amorphous silicon region deposited by the final deposition has the impurity. By such steps, the resultant amorphous silicon film prior to a heat treatment comprises double regions, for instance, an impurity undoped region in contact with the silicon oxide film and an impurity doped region in contact with the impurity undoped region.

The resultant amorphous silicon film is subsequently subjected to a heat treatment thereby causing the crystallization of the amorphous silicon film to form a polycrystalline silicon film. Concurrently, the diffusion of the impurity is caused into the impurity undoped region in the amorphous silicon film.

For the above crystallization, the amorphous silicon film comprises both the impurity undoped region in contact with the silicon oxide film and the impurity doped region in contact with the impurity undoped region. Further, the frequency of generation of crystal nuclei in the impurity undoped region is smaller than that in the impurity doped region. This permits the generation of the large number of crystal nuclei to be suppressed in the impurity undoped region in contact with the silicon oxide film, although the frequency of generation of crystal nuclei is likely to be high at the vicinity region of interface to the silicon oxide film. Thus, in the vicinity region, crystal nuclei may be grown into large crystal grains without being affected by the existence of adjacent grown crystal grains. Therefore, the polycrystalline silicon film may include the crystal grains having a sufficient large size on the average. The large size of crystal grains permits the resistivity of the polycrystalline silicon film to effectively be reduced.

Further, the crystallization of the amorphous silicon film is caused at the impurity doped region prior to the impurity undoped region. Also, the coefficient of the impurity diffusion in the polycrystalline silicon region is larger than that of the amorphous silicon region. Thus, when the heat treatment for the amorphous silicon film is carried out, the impurity doped amorphous silicon region is previously crystallized to form the polycrystalline silicon region. Concurrently, the impurity is sufficiently diffused into the impurity undoped region because the crystallized region has a large coefficient of the impurity diffusion as compared with the amorphous silicon region. Subsequently, a fresh impurity diffused region by the heat treatment is crystallized to form a further polycrystalline region having a large coefficient of the impurity diffusion. By such mechanism, the complete impurity diffusion may be realized.

Furthermore, the step coverage characteristic of the impurity undoped amorphous silicon region is better than that of the impurity doped amorphous silicon region. Thus, the existence of the impurity undoped region in contact with the silicon oxide film prevents the step coverage characteristic to be inferior.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

First, the mechanism of crystallization of amorphous silicon and the crystal grain size will be described because it is important to understand the above matters in order to understand the present invention. After that, a novel method of forming a polycrystalline silicon film according to the present invention will subsequently be described.

With regard to the mechanism of crystallization of amorphous silicon to form polycrystalline silicon, a crystal grain size tends to depend upon both the frequency of generation of crystal nuclei and the growth rate of crystal nuclei during a heat treatment. The crystal nucleus serves as a growth seed, which will grow into a crystal grain by a heat treatment. The amorphous silicon film is subjected to the heat treatment so that the crystallization of amorphous silicon to form a polycrystalline silicon is accomplished. Concurrently, the impurity which has been introduced into the amorphous silicon film is diffused.

If the frequency of generation of crystal nuclei is larger than the growth rate of crystal nuclei, the large number of crystal nuclei are produced in a unit cubic of amorphous silicon. In this case, the growth of the crystal nucleus into the crystal grain is affected by the existence of adjacent grown crystal grains thereby resulting in a small size of crystal grains on the average. In contrast, when the frequency of generation of crystal nuclei is sufficiently smaller than the growth rate of crystal nuclei, the small number of crystal nuclei are produced in a unit cubic of amorphous silicon. In this case, the crystal nucleus grows sufficiently without interference by the existence of adjacent grown crystal grains thereby resulting in a larger size of crystal grains on the average. This permits the resistivity of the polycrystalline silicon film to effectively be reduced.

Figure 4:
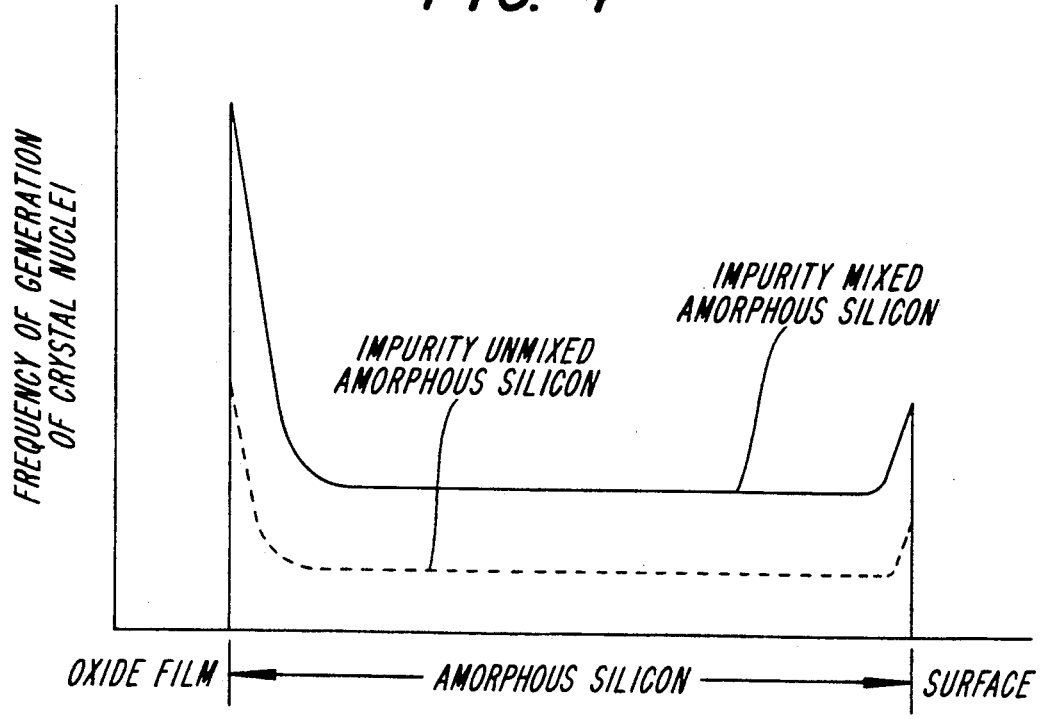
FIG. 4 is a diagram illustrating frequency profiles of generation of crystal nuclei in an impurity doped amorphous. silicon film and an impurity undoped amorphous silicon film.

In addition, FIG. 4 teaches following matters which are considerable. When the amorphous silicon film is deposited on a silicon oxide film or a quartz substrate, the frequency of generation of crystal nuclei in the vicinity region of an interface between the amorphous silicon film and the silicon oxide film is sufficiently higher than that of other regions of the amorphous silicon film. It is also considerable that the frequency of generation of crystal nuclei in the impurity doped amorphous silicon region is substantially larger than that in the impurity undoped amorphous silicon region. Especially, in case of a low temperature such as 600° C. of a heat treatment, both the frequency of generation of crystal nuclei and the growth rate of crystal nuclei in the impurity undoped amorphous silicon region are distinguishably smaller than those in the impurity doped amorphous silicon.

From the above descriptions, it is understood that when the amorphous silicon film comprises both an impurity undoped region in contact with the silicon oxide film and an impurity doped region in contact with the impurity undoped region, the generation and growth of a large number of crystal nuclei may be suppressed. Thus, in the impurity undoped region, the frequency of generation of crystal grains is insignificantly higher than that in the impurity doped region, but the growth rate of crystal nuclei in the impurity undoped region is lower than that in the impurity doped region. This allows the crystal nucleus to be grown into a large crystal grain without interference by growth of an adjacent crystal nucleus in the impurity undoped region in contact with the silicon oxide film or the quartz substrate.

On the other hand, the impurity undoped amorphous silicon film possesses a desirable step coverage characteristic in the deposition thereof as compared with the impurity doped amorphous silicon film. It is thus understood that when the impurity undoped amorphous silicon is deposited on the silicon oxide film or the quartz substrate up to a predetermined thickness followed by a deposition of the impurity doped amorphous silicon, the step coverage characteristic may effectively be improved.

With respect to dopant profiles, the coefficient of impurity diffusion in the amorphous silicon film is smaller than that in the polycrystalline silicon film. Also, as the above description, the growth rate of crystal nuclei in the impurity doped amorphous silicon film is faster than that of the impurity undoped amorphous silicon. Therefore, the crystallization of the impurity doped amorphous silicon is accomplished prior to that of the impurity undoped amorphous silicon. As a result of those matters, the impurity doped region of the amorphus silicon film is previously crystallized to form polycrystalline silicon prior to the impurity undoped region. Since the impurity doped polycrystalline silicon has a larger coefficient of the impurity diffusion, the impurity diffusion into the undoped region is effectively realized. This permits a final dopant profile across the polycrystalline silicon film after the heat treatment to be uniform, although the dopant profile has no uniformity before the heat treatment.

Figure 3A:
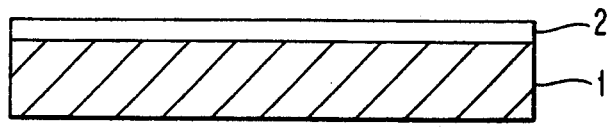
FIGS. 3A to 3C are fragmentary cross sectional elevation views illustrative of sequential processes involved in a novel method of fabricating a semiconductor device according to the present invention.

In accordance with the present invention, the impurity doped polycrystalline silicon film may be formed by the following steps. Referring to FIG. 3A, a silicon substrate 1 having a crystal orientation (100) is prepared and doped with boron to form a p-type substrate by which the resistivity of the substrate 1 becomes approximately 10 ohms centimeters. Subsequently, a silicon oxide film 2 having a thickness of 100 nanometers is formed on the p-type silicon substrate 1 by using a normal process.

Figure 3B:
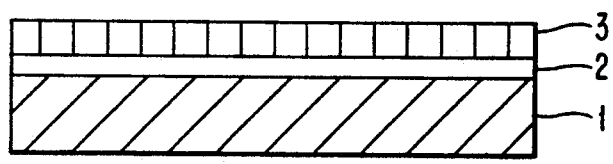

Referring to FIG. 3B, an amorphous silicon film 3 is deposited on the silicon oxide film 2 by using a chemical vapor deposition method. The above chemical vapor deposition of the amorphous silicon film 3 is accomplished by using a vertical low pressure chemical vapor deposition system, in which a deposition temperature and a deposition pressure remain at constant values of 510° C. and 0.15 torr respectively. For the above deposition, a disilane ($Si_2H_6$) gas is used as a growth gas for the amorphous silicon film 3. Also, a phosphine ($PH_3$) gas which is diluted with a nitrogen ($N_2$) gas up to 0.1% is used to introduce phosphorus (P) serving as an impurity into the amorphous silicon film 3. Further, a total flow rate of gases including both the source gas of disilane ($Si_2H_6$) and the diluted phosphine gas is supported at 560 sccm.

Figure 1:
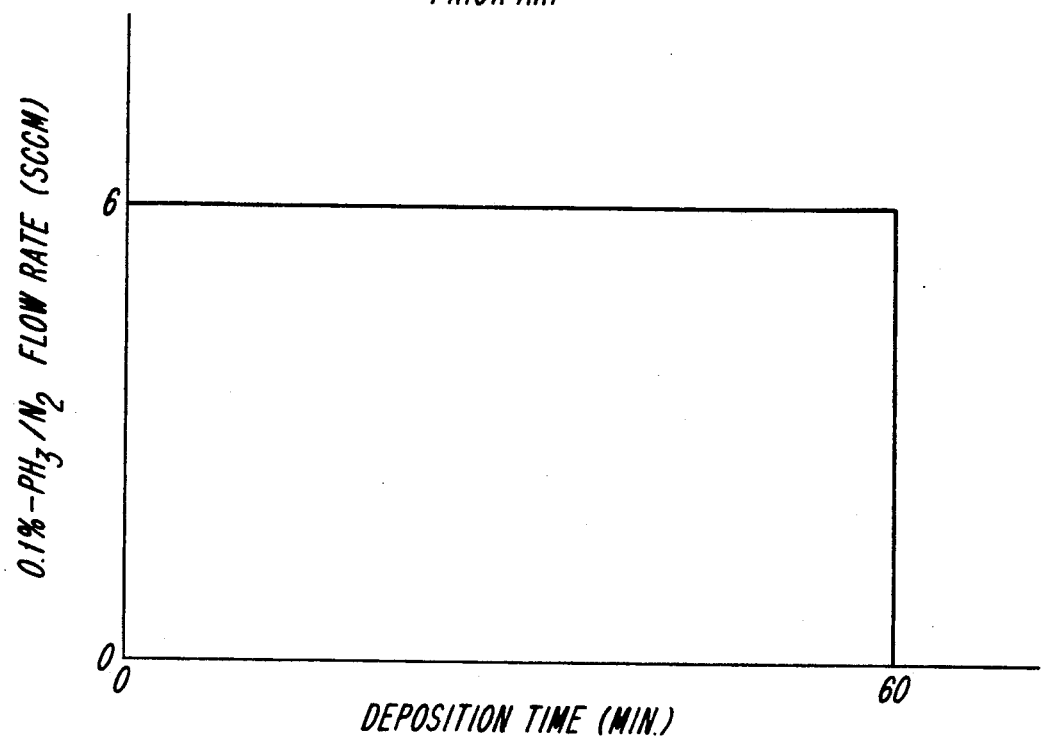
FIG. 1 is a diagram illustrating a variation of flow rate of an impurity gas used to introduce an impurity into amorphous silicon during a deposition of an amorphus silicon film in the prior art production method of an impurity doped polycrystalline silicon film.
Figure 2:
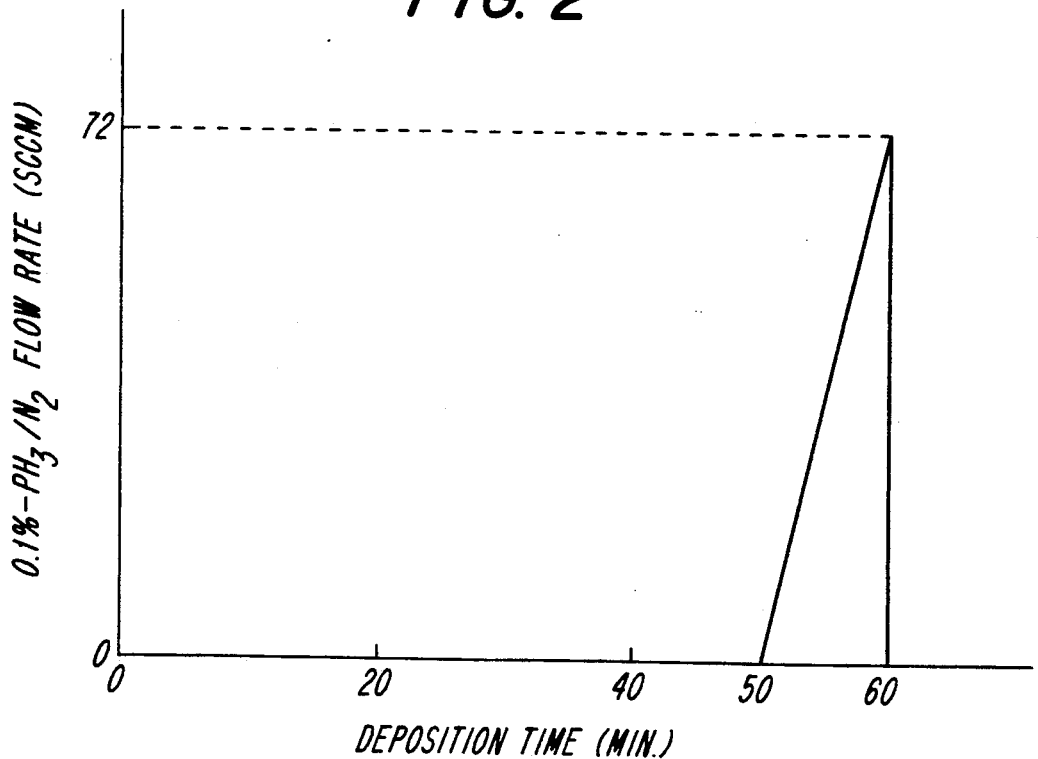
FIG. 2 is a diagram illustrating a variation of flow rate of an impurity gas used to introduce an impurity into amorphus silicon during a deposition of an amorphus silicon film in one embodiment of a novel production method according to the present invention.

FIG. 2 illustrates a variation of the flow rate of the 0.1%—$PH_3/N_2$ phosphine gas during the deposition of the amorphous silicon film 3. First, the flow rate of the 0.1%—$PH_3/N_2$ diluted phosphine gas remains at zero for 50 minutes so as not to introduce phosphorus into the amorphous silicon film 3. Thus, an impurity undoped amorphous silicon is deposited for 50 minutes thereby resulting in a formation of the impurity undoped amorphous silicon film having a thickness of approximately 340 nanometers. Subsequently, the flow rate of the 0.1%—$PH_3/N_2$ diluted phosphine gas is gradually and proportionally increased from zero to 72 sccm for 10 minutes so as to introduce phosphorus into the amorphous silicon thereby resulting in a formation of the impurity doped amorphous silicon film having a thickness of approximately 60 nanometers. The gradient of the flow rate of the diluted phosphine gas is so determined that a final dopant concentration of the polycrystalline silicon film after the heat treatment will become approximately $8 \times 10^{17}$ cm$^{-3}$, but the dopant concentration in the vicinity region of surface of the polycrystalline silicon film will become at approximately $1 \times 10^{19}$ cm$^{-3}$.

Figure 3C:
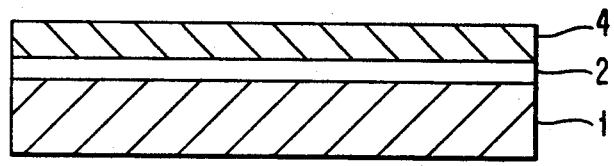

By such steps, the amorphous silicon film 3 is finally deposited up to a thickness of approximately 400 nanometers. After that, the resultant amorphous silicon film 3 is subjected to a heat treatment in a nitrogen ($N_2$) atmosphere at a temperature of 600° C. for 5 hours by using a horizontal diffusion reactor. As a result of the heat treatment, the amorphous silicon film 3 is completely crystallized to form a polycrystalline silicon film 4 as shown in FIG. 3C.

For the crystal grain of the polycrystalline silicon film, the polycrystalline silicon film 4 may be observed by using a transmission electron microscope to measure the crystal grain size. As a result of this measurement, the crystal grain size is approximately 4 micrometers on the average over the above conditions. In contrast, in the prior art the crystal grain size is approximately 2 micrometers on the average. The crystal grain size of this embodiment is twice as large as that of prior art. This reason is as follows. In the prior art, the flow rate of the 0.1%—$PH_3/N_2$ phosphine gas diluted with the nitrogen gas is supported at a predetermined value through the deposition time of the amorphous silicon film. In contrast, in this embodiment, the initial deposition for 50 minutes is carried out by using the growth gas only such as a silane based gas. In this initial deposition, the flow rate of the diluted phosphine gas remains at zero so as not to introduce phosphorus into the amorphous silicon film 3. Subsequently, the final deposition for 10 minutes is accomplished by using not only the growth gas but the diluted phosphine gas to introduce phosphorus serving as the impurity into the amorphous silicon film 3. In this final deposition, the flow rate of the diluted phosphine gas is slowly and proportionally increased from zero to a predetermined value.

Figure 5:
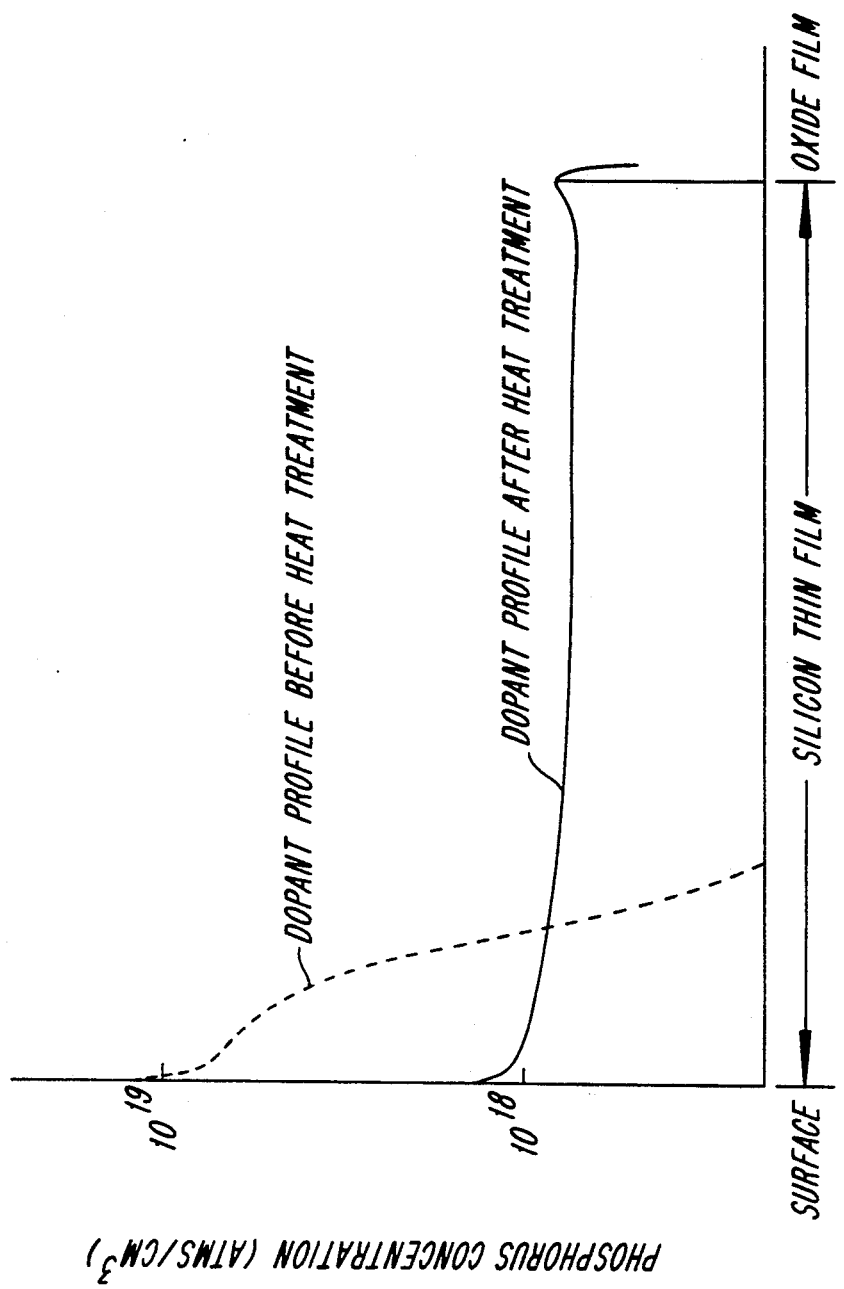
FIG. 5 is a diagram illustrative of both dopant profiles across an amorphous silicon film before a heat treatment and across a polycrystalline silicon film after the heat treatment.

FIG. 5 shows both dopant profiles across the amorphous silicon film before the heat treatment and across the polycrystalline silicon film after the heat treatment. The above both n-type dopant concentrations may be measured by using a secondary ion mass spectrometry. From FIG. 5, it is understood that the dopant profile becomes the uniform dopant profile by the accomplishment of the heat treatment. As the set forth descriptions, the amorphous silicon film 3 is subjected to the heat treatment thereby resulting in the fulfillment of crystallization of the amorphous silicon film 3 to form the polycrystalline silicon film 4.

For the above crystallization, the amorphous silicon film 3 comprises both an impurity undoped region abutting the silicon oxide film 2 and an impurity doped region abutting the impurity undoped region. Further, the frequency of generation of crystal nuclei in the impurity undoped region is smaller than that in the impurity doped region. This permits generation of a large number of crystal nuclei to be suppressed in the impurity undoped region abutting the silicon oxide film 2, although the frequency of generation of crystal nuclei is likely to be larger at the vicinity region of interface to the silicon oxide region 2. Thus, in the vicinity region, crystal nuclei may be grown into large crystal grains due to no interference by the existence of adjacent grown crystal grains. Therefore, the polycrystalline silicon film 4 may include crystal grains of a sufficient large size on the average.

Further, the crystallization is caused at the impurity doped region prior to that of the impurity undoped region. Also, the coefficient of the impurity diffusion in the polycrystalline silicon region is larger than that of the amorphous silicon region. Thus, when the heat treatment for the amorphous silicon film 3 is accomplished, amorphous silicon in the impurity doped region is previously crystallized to form the polycrystalline silicon region. Concurrently, the impurity is sufficiently diffused into the impurity undoped region due to a large coefficient of the impurity diffusion of the crystallized region. Subsequently, an impurity diffused region by the heat treatment is crystallized to form a further polycrystalline region having a large coefficient of the impurity diffusion. With such mechanism, the desirable impurity diffusion is realized. Actually, the resultant polycrystalline silicon film 4 has the uniform dopant profile as shown in FIG. 5. It is also observed that the impurity concentration of the polycrystalline silicon film 4 is approximately $7.5 \times 10^{17}$ cm$^{-3}$ on the average.

Since the polycrystalline silicon film has large crystal grains the resistivity of the polycrystalline silicon film is substantially reduced. Such polycrystalline silicon film is suitable as a film in semiconductor devices such as thin film transistors. Actually, when such polycrystalline silicon film is applied to the thin film transistor, the improved transistor possesses a large value of 37 cm$^2$/Vs of a drift mobility of the majority (dominant) carriers. The thin film transistor also possesses a large ON-current of 117 nA. In contrast, the prior art transistors possesses a drift mobility of 30 cm$^2$/Vs and an ON-current of 100 nA. It is therefore understood that the improved transistor has a higher speed performance and a higher driving ability.

Figure 6:
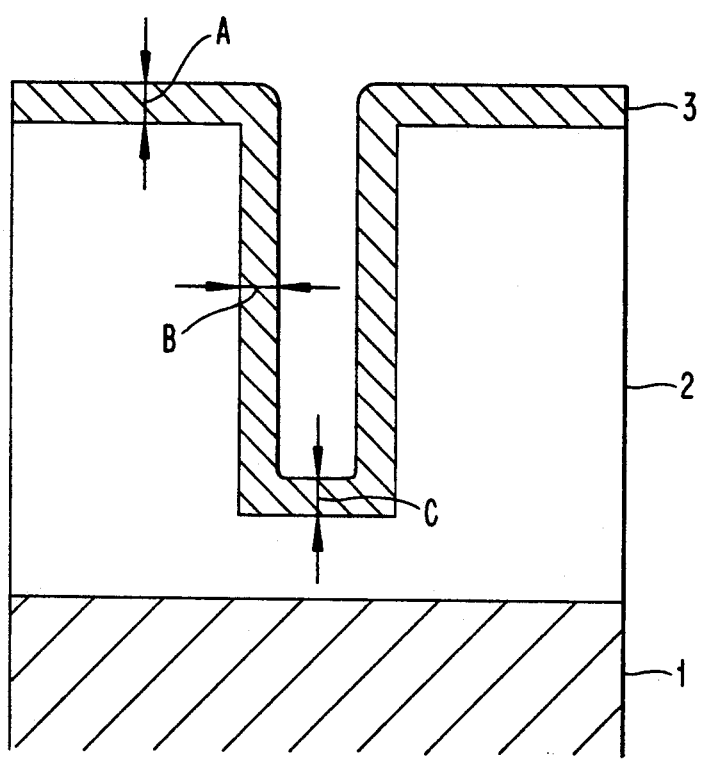
FIG. 6 is a fragmentary cross sectional elevation view illustrative of a semiconductor device including an impurity doped polycrystalline silicon film, from which a step coverage characteristic of a polycrystalline silicon film may be evaluated.

Such polycrystalline silicon film is also suitable as a capacitive electrode of a semiconductor memory device. FIG. 6 shows one embodiment of the memory device, from which the step coverage characteristic may also be evaluated. A silicon substrate 1 is prepared, after which a silicon oxide film 2 having a thickness of 2.5 micrometers is formed on the silicon substrate 1. Subsequently, a trench groove having a width of 0.5 micrometers and a depth of 2 micrometers is formed in the silicon oxide film 2. After that, an amorphous silicon film 3 is deposited both on the surface of the silicon oxide film 2 and in the trench groove by the novel above method according to the present invention.

In this case, since a polycrystalline silicon film which will subsequently be formed requires a high impurity dopant concentration, the chemical vapor deposition is accomplished under the following conditions. A gas such a silane based gase is used as a growth gas to form the amorphous silicon film 3. A phosphine (PH$_3$) gas which is diluted with a nitrogen (N$_2$) gas up to 4% is used to introduce phosphorus (P) serving as an impurity into the amorphous silicon film 3 in which the maximum flow rate of the diluted phosphine (PH$_3$) gas is at 200 sccm. During an initial deposition of the amorphous silicon film 3, the flow rate of the 4%—PH$_3$/N$_2$ diluted phosphine gas remains at zero so as not to introduce a phosphorus dopant into the amorphous silicon, by which an impurity undoped amorphous silicon region is deposited for 10 minutes. Subsequently, the flow rate of the 4%—PH$_3$/N$_2$ diluted phosphine gas is slowly and proportionally increased from zero to a predetermined flow rate for 10 minutes. Thus, the deposited amorphous silicon film comprises both an impurity undoped region abutting the silicon oxide film 2 and an impurity doped region abutting the impurity undoped region. After that, a heat treatment for the amorphous silicon film 3 is carried out so that the amorphous silicon is completely crystallized to form a polycrystalline silicon film 3. Concurrently, the impurity diffusion is accomplished. Other conditions such as temperature and pressure are the same as the above embodiment.

The step coverage of this embodiment will now be evaluated by making a comparison with the prior art with reference to FIG. 6 and TABLE 1.

TABLE 1

| Step coverage | invention | prior art |
|---|---|---|
| B/A | 0.91 | 0.80 |
| C/A | 0.95 | 0.83 |

In TABLE 1, A is the thickness of the polycrystalline silicon film 3 at the surface of the device, B is the thickness of the polycrystalline silicon film 3 at the opposite side walls in the trench groove and C is the thickness of the polycrystalline silicon film 3 at the bottom in the trench groove. By a comparison between the invention and the prior art, it is understood that the step coverage is improved. The reason for this is as follows. As described above, the step coverage characteristic of the impurity undoped amorphous silicon region is better than the steps coverage characteristic of the impurity doped amorphous silicon region. Thus, the existence of the impurity undoped region abutting the silicon oxide film 2 prevents the step coverage characteristic to be inferior. This improvement in the step coverage allows the capacitance characteristic of the memory device to effectively be improved.

With regard to the flow rate of the impurity gas, in the above embodiments, the initial deposition of the amorphous silicon film uses the growth gas only such as a silane based gas. In the final deposition of the amorphous silicon film, not only the growth gas but the phosphine gas diluted with the nitrogen gas is used to introduce phosphorus serving as an impurity into the amorphous silicon film. As a result, the amorphous silicon film prior to the heat treatment comprises at least both the impurity undoped region abutting the silicon oxide film and the impurity doped region abutting the impurity undoped region. Although in the above embodiments the flow rate of the diluted phosphine gas is continuously increased from zero to a predetermined value, the flow rate of the phosphine gas may slowly and discontinuously be increased.

In addition, while in the above embodiments the amorphous silicon film prior to the heat treatment includes no impurity such as phosphorus at the region deposited by the initial deposition, the region deposited by the initial deposition may include a mere impurity. It is available that the flow rate of the phosphine gas is slowly increased through the deposition of the amorphous silicon film from zero or an extremely low value to a predetermined high value.

Although in the above embodiments the polycrystalline silicon film is formed on the silicon substrate, the novel method of the present invention may applied to a formation of the polycrystalline silicon on a quartz substrate. As the above description with respect to the frequency of generation of crystal nuclei, an amorphous silicon film deposited on the quartz substrate is likely to have a higher frequency of generation of crystal nuclei. Therefore, the flow rate of an impurity gas such as a phosphine gas remains at approximately zero before the flow rate is gradually increased to a predetermined value. As a result of this, in the initial deposition an impurity undoped amorphous silicon film is deposited on the quartz substrate, after which an impurity doped amorphous silicon film is deposited on the impurity doped region. The existence of the impurity undoped region abutting the quartz substrate prevents the large number of crystal nuclei to be generated in the vicinity region thereof by which each crystal nuclei may grow into a crystal grain having a large size on the average without interference by the growth of an adjacent crystal nucleus. This allows the resistivity of the resultant polycrystalline silicon film to substantially be reduced. It is of course understood that the present invention may applied to semiconductor devices which includes the polycrystalline silicon film abutting the quartz substrate, such as a thin film transistor.

Furthermore, for the conditions of the deposition of the amorphous silicon film, the growth gas, the impurity gas and the deposition time are variable by matching any requirements. For the above heat treatment, temperature, pressure and heating times may also be varied by matching any requirements.

While in the above embodiments the polycrystalline silicon film formed by the novel method of the present invention may be applied to the thin film transistor or the capacitive electrode of the semiconductor memory device, it is of course available to apply the polycrystalline silicon film to other semiconductor devices which require a polycrystalline silicon film possessing a reduced resistivity or a good step coverage.

Whereas modifications of the present invention will no doubt be apparent to a person of ordinary skill in the art, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A method of forming a polycrystalline silicon film, comprising the steps of:
   depositing a first layer made of amorphous silicon having a dopant concentration of approximately zero on a silicon oxide film or a quartz substrate;
   depositing a second layer made of amorphous silicon having a dopant concentration greater than zero on said first layer; and
   subjecting said first and second layers to a heat treatment so that said first and second layers made of amorphous silicon are crystallized to form a polycrystalline silicon film having a large crystal grain size and a diffusion of dopant into said first layer is concurrently accomplished.

2. The method of forming a polycrystalline silicon film as claimed in claim 1, wherein said first and second layers made of amorphous silicon are deposited by using a chemical vapor deposition method in which deposition of said first layer uses a growth gas only but deposition of said second layer uses both said growth gas and an impurity gas.

3. The method of forming a polycrystalline silicon film as claimed in claim 2, wherein the flow rate of said impurity gas remains at approximately zero during deposition of said first layer after which said flow rate of said impurity gas is gradually increased from approximately zero to a value greater than zero during deposition of said second layer.

4. The method of forming a polycrystalline silicon film as claimed in claim 3, wherein during deposition of said second layer, said flow rate of said impurity gas is continuously increased.

5. The method of forming a polycrystalline silicon film as claimed in claim 3, wherein during deposition of said second layer, said flow rate of said impurity gas is discontinuously increased.

6. The method of forming a polycrystalline silicon film as claimed in claim 1, wherein said crystal grain size of said polycrystalline silicon film is approximately 4 micrometers on the average.

7. A method of forming polycrystalline silicon film, comprising the steps of:
   forming a silicon oxide film on a silicon substrate;
   depositing a first layer made of amorphous silicon having a dopant concentration of approximately zero on said silicon oxide film;
   depositing a second layer made of amorphous silicon having a dopant concentration greater than zero on said first layer; and
   subjecting said first and second layers to a heat treatment so that said first and second layers made of amorphous silicon are crystallized to form a polycrystalline silicon film having a large crystal grain size and a diffusion of dopant into said first layer is concurrently accomplished.

8. The method of forming a polycrystalline silicon film as claimed in claim 7, wherein said first and second layers made of amorphous silicon are deposited by using a chemical vapor deposition method in which deposition of said first layer uses a growth gas only but deposition of said second layer uses both said growth gas and an impurity gas.

9. The method of forming a polycrystalline silicon film as claimed in claim 8, wherein the flow rate of said impurity gas remains at approximately zero during deposition of said first layer after which said flow rate of said impurity gas is gradually increased from approximately zero to a value greater than zero during deposition of said second layer.

10. The method of forming a polycrystalline silicon film as claimed in claim 9, wherein during deposition of said second layer, said flow rate of said impurity gas is continuously increased.

11. The method of forming a polycrystalline silicon film as claimed in claim 9, wherein during deposition of said second layer, said flow rate of said impurity gas is discontinuously increased.

12. The method of forming a polycrystalline silicon film as claimed in claim 7, wherein said crystal grain size of said polycrystalline silicon film is approximately 4 micrometers on the average.

* * * * *